(12) United States Patent
Ang et al.

(10) Patent No.: US 7,381,620 B1
(45) Date of Patent: Jun. 3, 2008

(54) OXYGEN ELIMINATION FOR DEVICE PROCESSING

(75) Inventors: Boon-Yong Ang, Cupertino, CA (US); Hidehiko Shiraiwa, San Jose, CA (US); Simon S. Chan, Saratoga, CA (US); Harpreet K. Sachar, Milpitas, CA (US); Mark Randolph, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 184 days.

(21) Appl. No.: 11/371,023

(22) Filed: Mar. 9, 2006

(51) Int. Cl.
*H01L 21/336* (2006.01)
(52) U.S. Cl. ............... 438/288; 438/770; 438/775; 438/778; 438/787; 438/791; 257/E21.18; 257/E21.679

(58) Field of Classification Search ........... 438/288, 438/764; 257/E21.177, E21.18, E21.613
See application file for complete search history.

(56) References Cited

U.S. PATENT DOCUMENTS 5,885,870 A * 3/1999 Maiti et al. ............ 438/261
2005/0048794 A1* 3/2005 Brask et al. ........... 438/768

* cited by examiner

*Primary Examiner*—Michael S. Lebentritt
*Assistant Examiner*—Cheung Lee
(74) *Attorney, Agent, or Firm*—Harrity Snyder LLP (57) ABSTRACT

A method includes forming at least a portion of a semiconductor device in a processing chamber containing oxygen and removing substantially all of the oxygen from the processing chamber. The method further includes forming remaining portions of the semiconductor device in the processing chamber without the presence of oxygen.

20 Claims, 10 Drawing Sheets

OXYGEN ELIMINATION FOR DEVICE PROCESSING

TECHNICAL FIELD

The present invention relates generally to semiconductor devices and, more particularly, to eliminating the presence of oxygen during semiconductor device processing.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are a type of EEPROM device in which memory cells can be programmed and erased electrically as a block or group.

Product development efforts in EEPROM device technology have focused on increasing the programming speed, lowering programming and reading voltages, increasing data retention time, reducing cell erasure times and reducing cell dimensions. One conventional structure used for fabricating an EEPROM device is an oxide-nitride-oxide (ONO) structure. One EEPROM device that utilizes the ONO structure is a silicon-oxide-nitride-oxide-silicon (SONOS) type device. In a SONOS type device, an ONO stack is formed on a silicon substrate. A silicon control gate is then formed over the ONO stack. Another EEPROM device that utilizes the ONO structure is a floating gate FLASH memory device, in which the ONO structure is formed over the floating gate, typically a polysilicon floating gate.

In SONOS devices, during programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon oxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

DISCLOSURE OF THE INVENTION

Typically, during processing of a semiconductor, such as a SONOS type memory device, oxygen is present in the device processing chamber. Oxygen, however, may react with the layers of the memory device, such as dielectric layers in the SONOS structure, thereby degrading the performance of the device. For example, after formation of a gate structure, subsequent device formation processing in the presence of oxygen may lead to the oxygen attacking one or more dielectric layers in the gate structure. Degradation in the dielectric layer(s) may lower the dielectric constant of the dielectric layer and may lead to poorer device performance, such as, for example, slower memory erase speeds in non-volatile memory devices.

Consistent with aspects of the invention, oxygen may be removed from the processing chamber at a certain point during device formation to eliminate device degradation due to reaction between the components of the device and the oxygen in the chamber. In one implementation, the processing chamber may be evacuated to remove the oxygen. In another implementation, the oxygen may be displaced with another gas, such as, for example, nitrogen ($N_2$).

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method that may include forming at least a portion of a semiconductor device in a processing chamber containing oxygen. The method may further include removing substantially all of the oxygen from the processing chamber and forming remaining portions of the semiconductor device in the processing chamber without the presence of oxygen.

According to another aspect of the invention, a method may include removing substantially all of the oxygen from a processing chamber and forming at least some portions of a memory device within the processing chamber subsequent to removal of substantially all of the oxygen.

According to a further aspect of the invention, a method may include forming a first layer comprising an oxide material on a substrate in a processing chamber and forming a second layer comprising a material for storing charges on the first layer. The method may further include forming a third layer comprising a high dielectric constant material on the second layer and forming a fourth layer comprising a gate electrode material on the third layer. The method may also include etching the first, second, third and fourth layers to produce a gate structure and removing oxygen from the processing chamber. The method may additionally include forming a remaining portion of the memory device without the presence of the oxygen.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
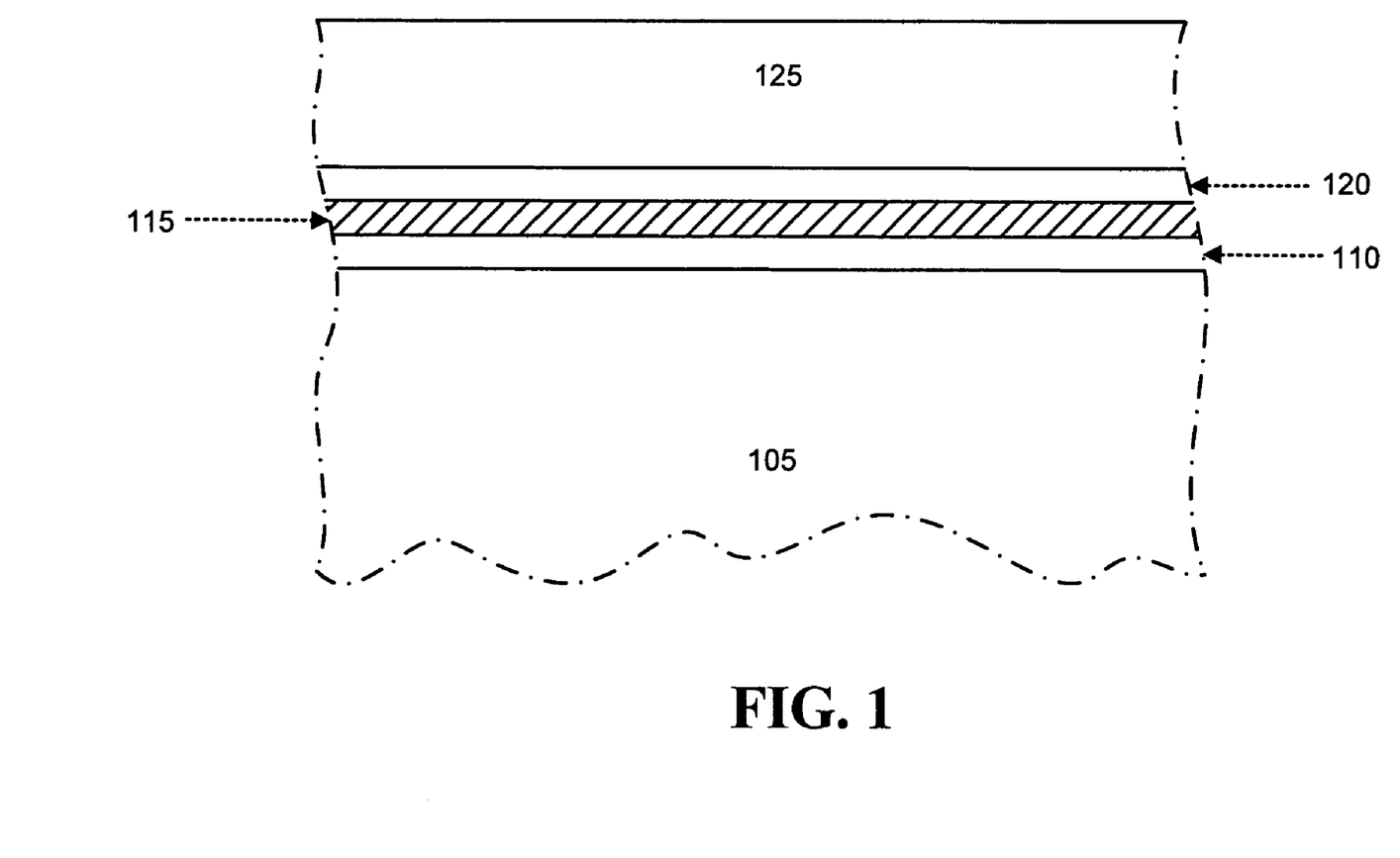
FIG. 1 illustrates the formation of a high dielectric constant layer of dielectric material upon a charge storage layer in a layered stack of a semiconductor device consistent with an aspect of the invention.

FIG. 1 illustrates a cross-section of a semiconductor substrate 105 according to an exemplary embodiment of the invention. Substrate 105, consistent with one aspect, may include a crystal silicon wafer. In other implementations, substrate 105 may include a gallium arsenide layer, a silicon-on-insulator structure, a germanium layer, a silicon-germanium layer, or other conventional materials used to form a semiconductor substrate. An oxide layer 110 may be formed on substrate 105. Oxide layer 110 may be formed on substrate 105 using, for example, existing deposition processes, such as a chemical vapor deposition (CVD) process. Oxide layer 110 may include oxide materials, such as, for example, silicon oxide (e.g., $SiO_2$), or silicon oxynitride. The thickness of oxide layer 110 may range, for example, from about 30 Å to about 100 Å.

A charge storage layer 115 may be formed on oxide layer 110 using, for example, existing deposition processes, such as conventional CVD processes. In one exemplary embodiment, charge storage layer 115 may include a nitride material, such as, for example, silicon nitride ($Si_3N_4$). In other embodiments, charge storage layer 115 may include other known dielectric materials that may be used to store a charge. The thickness of charge storage layer 115 may range, for example, from about 40 Å to about 100 Å.

A high dielectric constant (K) layer 120 may be formed on charge storage layer 115. High K layer 120 may be formed on charge storage layer 115 using, for example, existing deposition processes, such as a CVD process. High K layer 120 may include oxide materials, such as, for example, $Al_2O_3$, though other high K materials, such as, for example, $HfO_2$, HfAlO, or HfAlSi may be used. High K layer 120 may include a dielectric material that has a higher dielectric constant than the dielectric constant associated with the material of oxide layer 110. In some implementations, high K layer 120 may include a dielectric material having a dielectric constant greater than approximately 7. The thickness of high K layer 120 may range, for example, from about 50 Å to about 150 Å.

Figure 2:
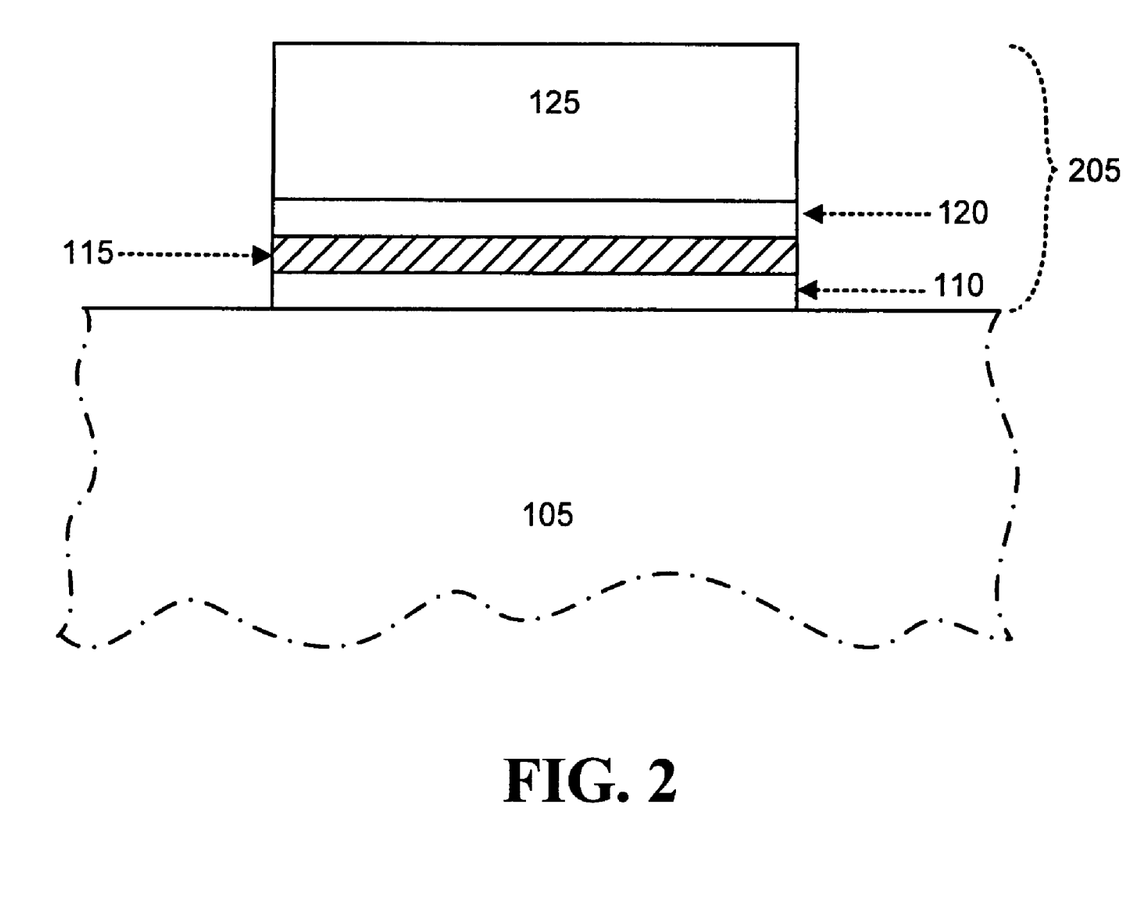
FIG. 2 illustrates etching of the layers of FIG. 1 to produce a gate structure consistent with an aspect of the invention.

A control gate electrode layer 125 may be formed on high K layer 120 using, for example, existing deposition processes. Control gate electrode layer 125 may include, for example, polycrystalline silicon, or a metal such as TaN or TiN. The thickness of control gate electrode layer 125 may range, for example, from about 1000 Å to about 2000 Å. As shown in FIG. 2, layers 110, 115, 120 and 125 may, in one exemplary embodiment, be etched, using existing photolithographic and etching processes, to form a gate structure 205.

Figure 3:
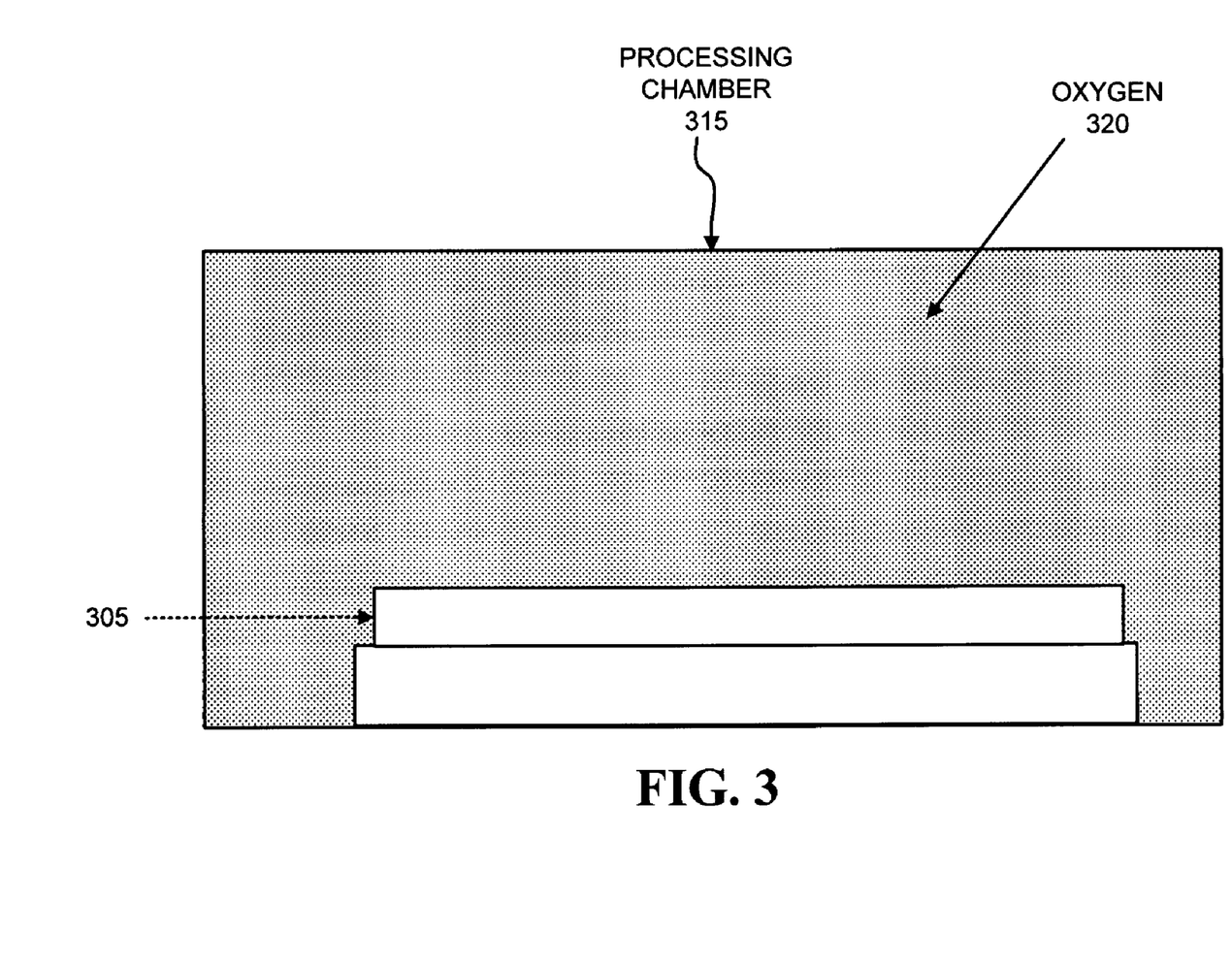
FIG. 3 illustrates oxygen present within a processing chamber consistent with an aspect of the invention.

Subsequent to formation of gate structure 205, oxygen may be removed from a processing chamber in which processing is being performed upon a wafer that includes gate structure 205. As shown in FIG. 3, a wafer 305, that includes gate structure 205 (not shown), may be processed in a processing chamber 315 filled with oxygen 320. Oxygen 320 may be a byproduct of one or more of the reactions used to form gate structure 205 or may be used as a reactant to form one or more of the layers of gate structure 205. Oxygen 320 in chamber 315 may attack high K layer 120, or the interface between layer 120 and gate electrode layer 125, thus, degrading the performance of the subsequently completed device. Reaction of oxygen with layer 120 may lower the dielectric constant of layer 120 due to increased oxygen content. In implementations in which gate structure 205 is used in a memory device, degradation of high K layer 120 may slow the erase speed of the memory device.

Figure 4A:
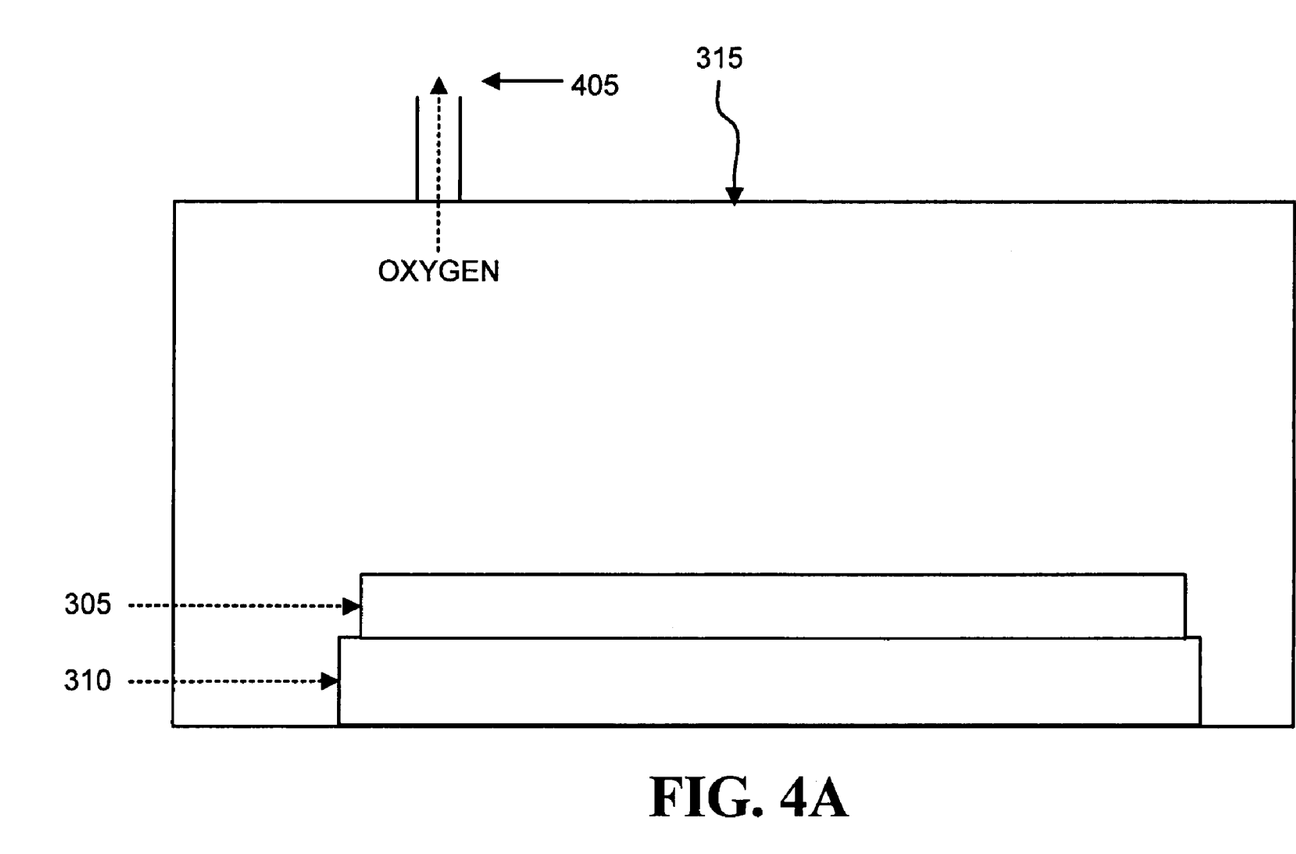
FIG. 4A illustrates the evacuation of oxygen from the processing chamber of FIG. 3 consistent with one aspect of the invention.
Figure 4B:
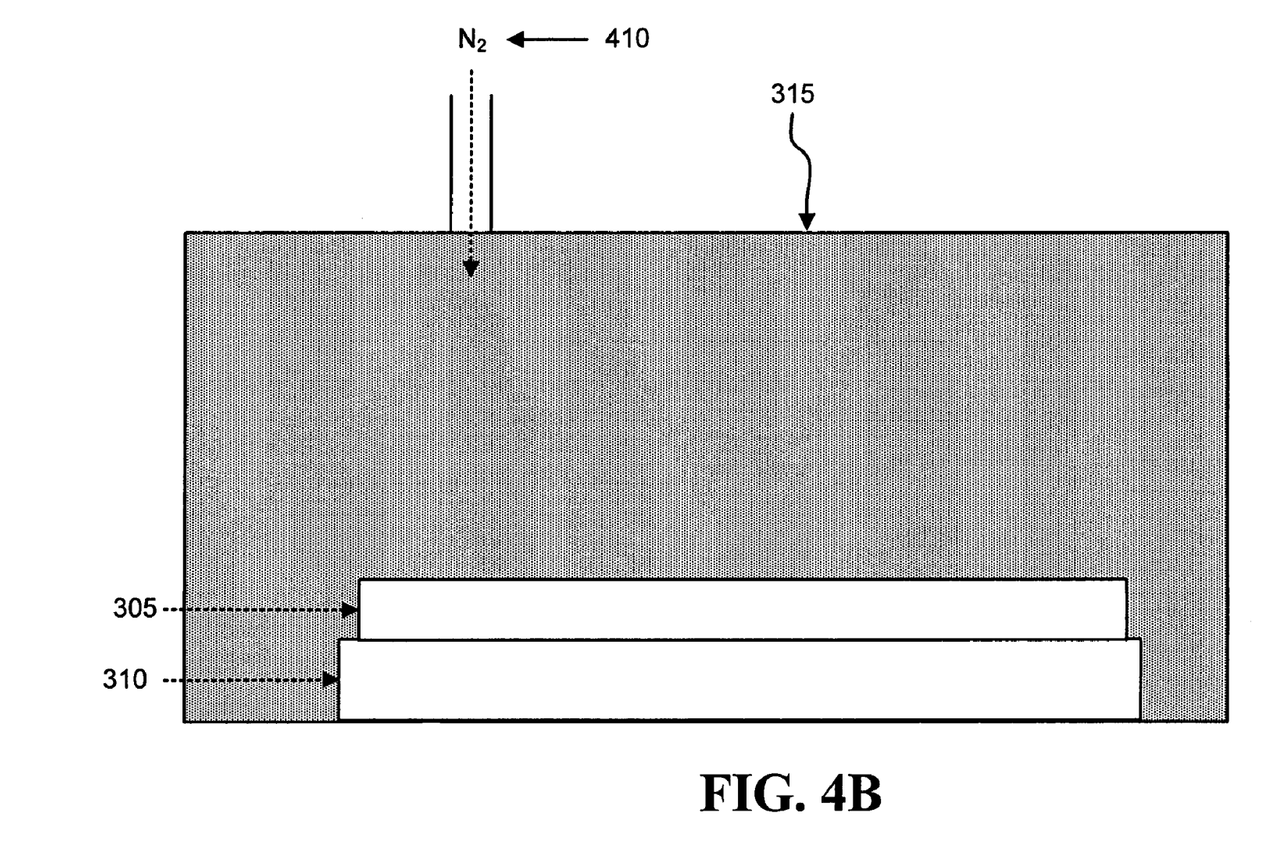
FIG. 4B illustrates the displacement of oxygen from the processing chamber of FIG. 3 using a gas other than oxygen consistent with another aspect of the invention.

In one implementation, the oxygen 320 may be evacuated 405 from processing chamber 315, as shown in FIG. 4A, to leave a substantially oxygen free vacuum in chamber 315. In another implementation, oxygen 320 in processing chamber 315 may by substantially displaced by another gas, such as, for example, nitrogen ($N_2$) 410, as shown in FIG. 4B. Subsequent device processing, such as, for example, annealing or forming other layers, may be performed with the oxygen removed from processing chamber 315 to prevent degradation of high K layer 120. The particular details associated with removing oxygen 320 are not described herein. One of ordinary skill in the art, however, would be able to remove the oxygen 320 from chamber 315 given the guidance disclosed herein. For example, if the oxygen 320 is evacuated from processing chamber 315, then substantially all of oxygen 320, such as approximately 95% or more of oxygen 320, may be evacuated from processing chamber 315. As another example, if oxygen 320 is displaced by another gas, such as $N_2$, then approximately 95% percent or more of oxygen 320 may be displaced from processing chamber 315 by a gas other than oxygen.

Figure 5:
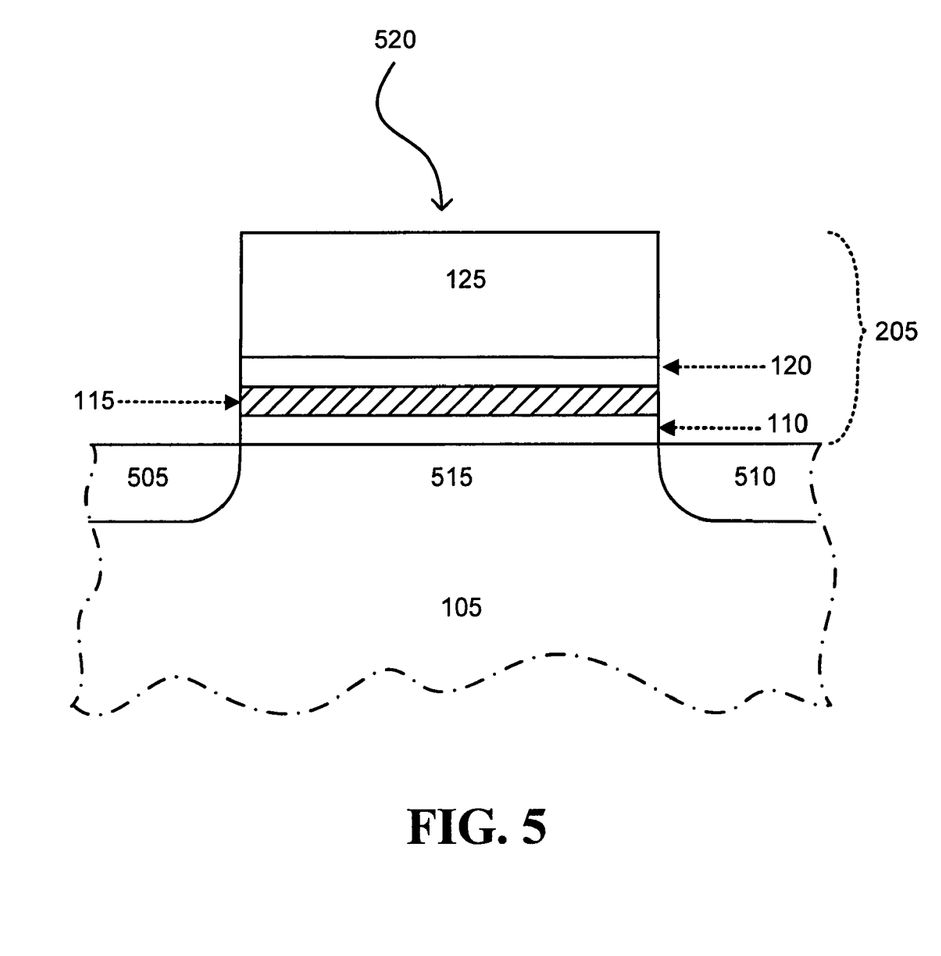
FIG. 5 illustrates the formation of source and drain regions adjacent the gate structure of FIG. 2 consistent with an aspect of the invention.

As shown in FIG. 5, a source region 505 and a drain region 510 may then be formed in substrate 105 to form a device 520, such as a SONOS type memory device. Source region 505 and drain region 510 may be doped with n-type or p-type impurities based on particular end device requirements. The particular implantation dosages and energy used to implant the impurities is not described herein in order not to unduly obscure the thrust of the invention. One of ordinary skill in the art, however, would be able to optimize the formation of source region 505 and drain region 510 based on the particular end device requirements. Formation of source region 505 and drain region 510 creates a channel region 515 in substrate 105 between the source region 505 and drain region 510.

Figure 6A:
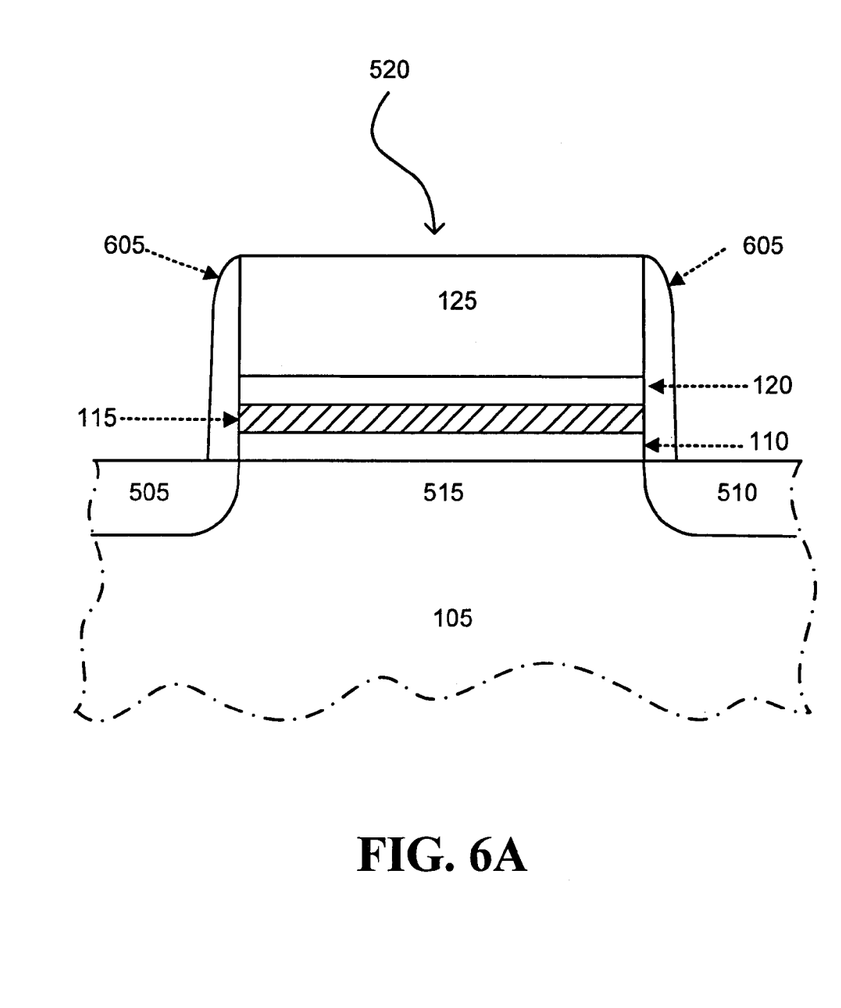
FIGS. 6A & 6B illustrate the formation of spacers adjacent the sidewalls of the gate structure of FIG. 5 consistent with an aspect of the invention.
Figure 6B:
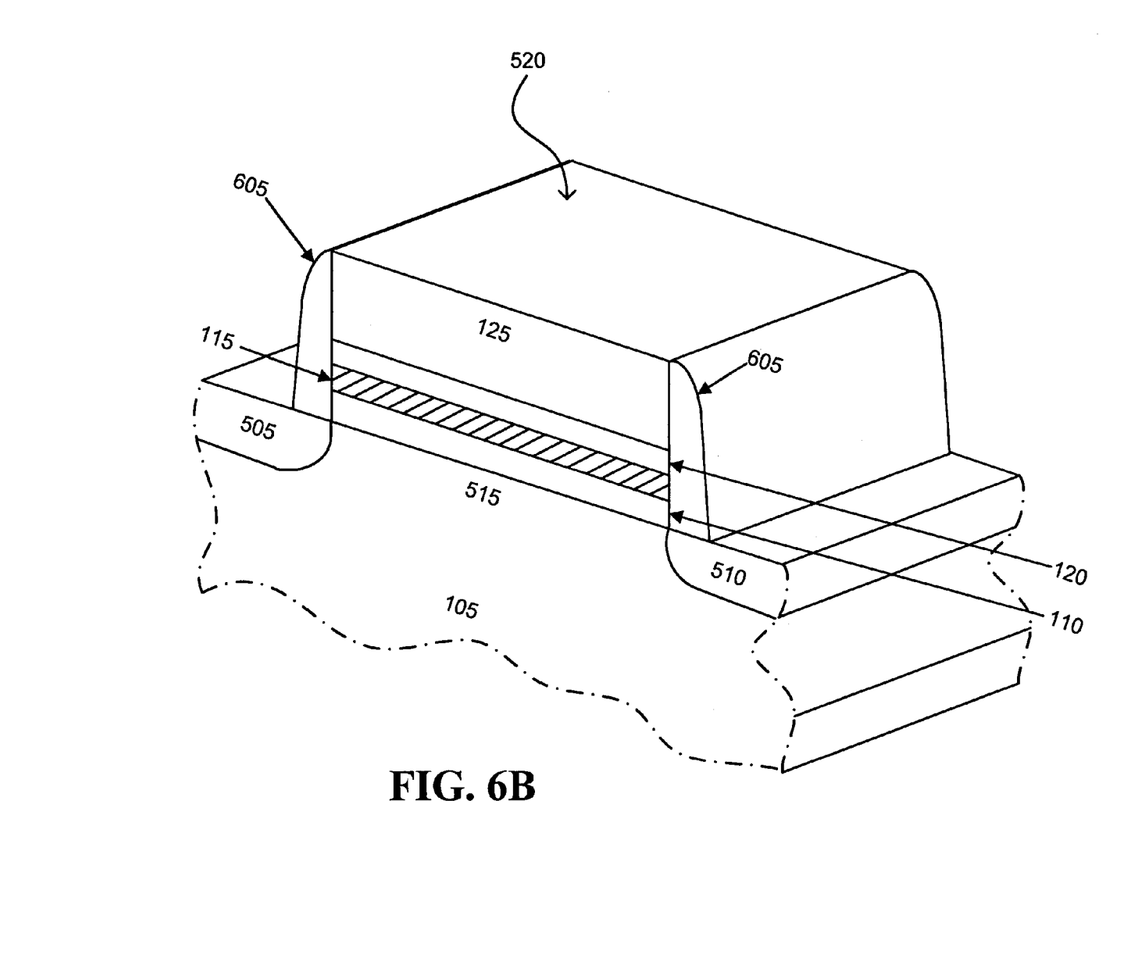

In some implementations, sidewall spacers 605 may then be formed adjacent the vertical side surfaces of device 520, as shown in FIGS. 6A and 6B. Spacers 605 may be formed of a dielectric material such as silicon nitride. Spacers 605 may function to electrically isolate cells of a subsequently formed memory device from each other. The width and height of spacers 605 may be optimized based on the end device requirements. In other exemplary embodiments, device 520 may be formed with planar structures, without sidewall spacers 605, where layers of the device 520 may extend laterally in both directions. In such embodiments, source and drain regions may be formed with impurities being implanted through the dielectric layers (e.g., layers 110, 115 and 120).

Figure 7A:
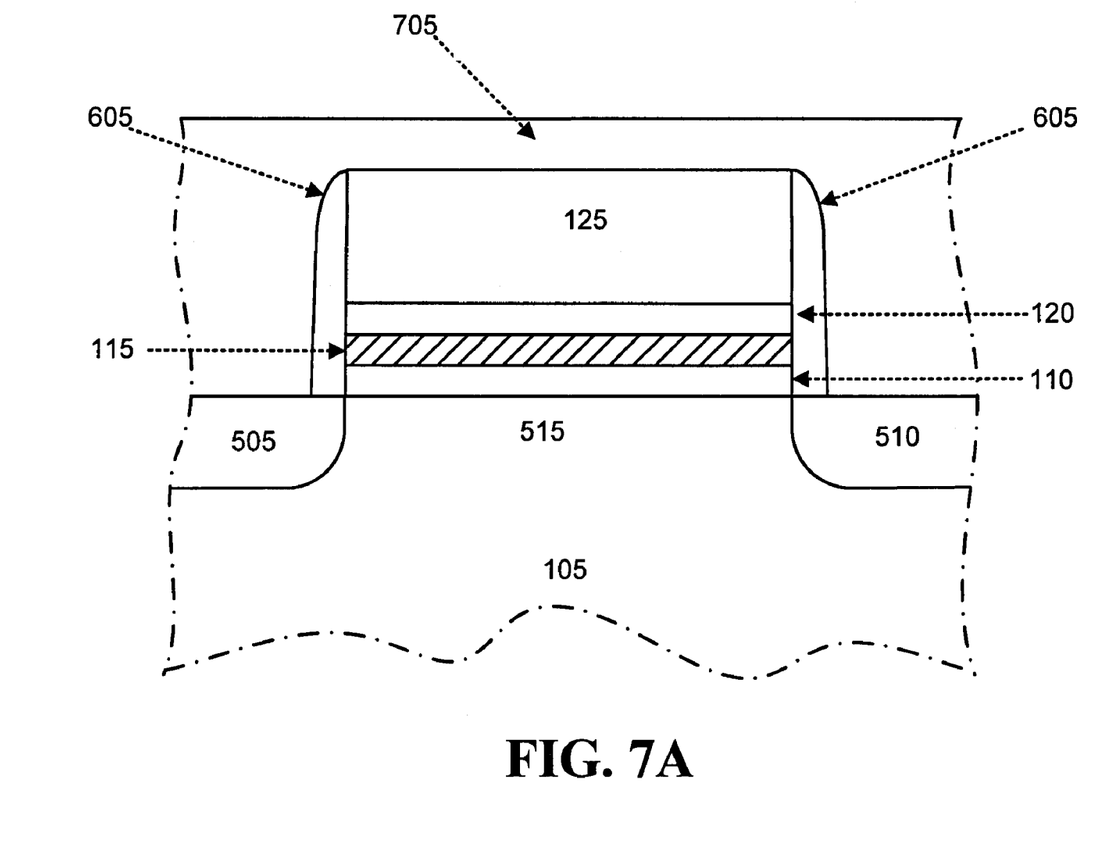
FIGS. 7A & 7B illustrate the formation of an interlayer dielectric over the gate structure of FIGS. 6A & 6B consistent with an aspect of the invention.
Figure 7B:
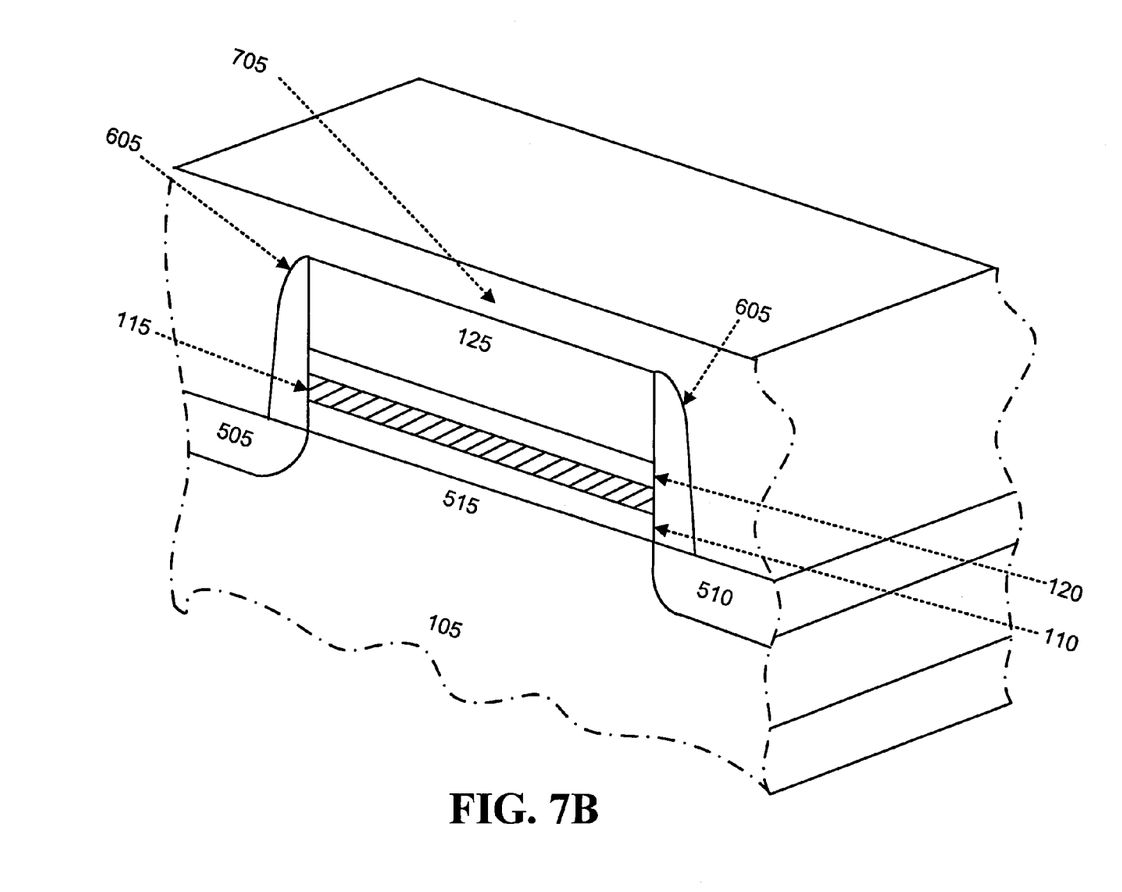

As shown in FIGS. 7A and 7B, an interlayer dielectric (ILD) 705 may be formed over device 520. ILD 705 may be formed over device 520 using, for example, existing deposition processes. ILD 705 may include, for example, borophosphosilicate glass (GPSG), or any other dielectric material. The thickness of ILD 705 may vary based on the size of device 520, or based on other design or fabrication parameters. In one exemplary embodiment, the thickness of ILD 705 may range from about 5000 Å to about 15000 Å. ILD 705 may be polished back to a planar surface using, for example, an existing chemical-mechanical polishing (CMP) process. One or more vias (not shown) may then be formed in ILD 705, followed by deposition of a metal, such as copper, tungsten, or aluminum, to form contacts. An interconnect structure may then be formed to interconnect different components of device 520, or to interconnect device 520 with other devices (not shown).

In an exemplary implementation, device 520 illustrated in FIGS. 7A and 7B may represent a single memory cell in a non-volatile memory device. During operation of device 520, voltages may be applied to control gate electrode 125, source region 505 and drain region 510. The applied voltages may cause electrical charge from source region 505 and drain region 510 to propagate across channel region 515 and to tunnel from channel region 515 through oxide layer 110 for retention in charge storage layer 115. The layered stack structure 205 that includes oxide layer 110, charge storage layer 115 and high K dielectric layer 120 permits channel erase in device 520, where charge in charge storage layer 115 may be discharged via channel region 515. By removing oxygen from the device processing chamber 315, no degradation of layer 120 may occur during processing of device 520, thus, ensuring that channel erase speed is not impaired due to damage to channel 515.

In an exemplary implementation consistent with the invention, memory device 520, as illustrated in FIG. 7B, may include a single memory cell that may be configured to store two bits of data. That is, charge storage layer 115 may be programmed to store two separate bits of data by localizing the first and second charges to the respective left and right sides of charge storage layer 115 illustrated in FIG. 7B. For example, each of the two bits of memory device 520 may be programmed independently by, for example, channel hot electron injection, to store a charge representing a bit on each respective side of the charge storage layer 115. In this manner, the charges in charge storage layer 115 become effectively trapped on each respective side of charge storage layer 115. During erasing, the charges stored in charge storage layer 115 may tunnel through oxide layer 110 into the source region 505 and drain region 510, respectively.

In this manner, the density of an array of multiple memory devices 520 may be increased as compared to conventional memory devices that store only one bit of data per cell. In alternative implementations, each memory device 520 may be configured to store one bit of data per memory device 520.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts have been described above, the order of the acts may vary in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A method, comprising:
   forming at least a portion of a semiconductor device in a processing chamber containing oxygen, where the at least a portion of the semiconductor device comprises a layer of dielectric material and where the at least a portion of the semiconductor device further comprises the layer of dielectric material formed on a nitride layer, the nitride layer formed on an oxide layer, and the oxide layer formed on a substrate;
   removing substantially all of the oxygen from the processing chamber; and
   forming remaining portions of the semiconductor device in the processing chamber without the presence of oxygen.

2. The method of claim 1, wherein removing substantially all of the oxygen from the processing chamber comprises:
   evacuating the oxygen from the processing chamber.

3. The method of claim 1, wherein removing substantially all of the oxygen from the processing chamber comprises:
   displacing the oxygen in the processing chamber with another gas.

4. The method of claim 3, wherein the gas comprises $N_2$.

5. The method of claim 1, wherein the semiconductor device comprises a non-volatile memory.

6. The method of claim 1, wherein the layer of dielectric material comprises $Al_2O_3$.

7. The method of claim 1, wherein removal of the oxygen from the processing chamber inhibits degradation of device performance due to oxygen reaction with the layer of dielectric material.

8. A method of forming a memory device, comprising:
   forming a first layer comprising an oxide material on a substrate in a processing chamber;
   forming a second layer comprising a material for storing charges on the first layer;
   forming a third layer comprising a high dielectric constant material on the second layer;
   forming a fourth layer comprising a gate electrode material on the third layer;
   etching the first, second, third and fourth layers to produce a gate structure;
   removing oxygen from the processing chamber; and
   forming a remaining portion of the memory device without the presence of the oxygen.

9. The method of claim 8, wherein the dielectric constant of the third layer is greater than the dielectric constant of the first layer.

10. The method of claim 9, wherein the dielectric constant of the third layer is approximately greater than 7.

11. The method of claim 8, wherein removing the oxygen from the processing chamber comprises:
    evacuating the oxygen from the processing chamber.

12. The method of claim 8, wherein removing the oxygen from the processing chamber comprises:
    displacing the oxygen in the processing chamber with another gas.

13. The method of claim 12, wherein the gas comprises $N_2$.

14. The method of claim 8, wherein the first layer comprises a silicon oxide, the second layer comprises a nitride, the third layer comprises an aluminum oxide, and the fourth layer comprises polysilicon.

15. A method of forming a memory device, comprising:
    forming a first layer comprising an oxide material on a substrate in a processing chamber;
    forming a second layer comprising a material for storing charges on the first layer;
    forming a third layer comprising a high dielectric constant material on the second layer;
    forming a fourth layer comprising a gate electrode material on the third layer;
    etching the first, second, third and fourth layers to produce a gate structure;
    removing at least a substantial portion of gaseous oxygen contained in the processing chamber; and
    forming a remaining portion of the memory device subsequent to removing the at least a substantial portion of gaseous oxygen from the processing chamber.

16. The method of claim 15, where the dielectric constant of the third layer is greater than the dielectric constant of the first layer.

17. The method of claim 15, where removing the at least a substantial portion of gaseous oxygen contained in the processing chamber comprises:
    evacuating at least about 95% of the gaseous oxygen from the processing chamber.

18. The method of claim 15, where removing the at least a substantial portion of gaseous oxygen contained in the processing chamber comprises:
    displacing at least about 95% of the gaseous oxygen in the processing chamber with another gas.

19. The method of claim 18, where the other gas comprises $N_2$.

20. The method of claim 15, where the first layer comprises a silicon oxide, the second layer comprises a nitride, the third layer comprises an aluminum oxide, and the fourth layer comprises polysilicon.

* * * * *